United States Patent
Fulcher

(10) Patent No.: US 6,867,488 B2
(45) Date of Patent: Mar. 15, 2005

(54) THICK METAL TOP LAYER

(75) Inventor: Edwin M. Fulcher, Palo Alto, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/304,974

(22) Filed: Nov. 26, 2002

(65) Prior Publication Data

US 2004/0099884 A1 May 27, 2004

(51) Int. Cl.7 .............................................. H01L 23/52

(52) U.S. Cl. ...................................... 257/691; 257/678

(58) Field of Search ................................ 257/669, 686, 257/678, 697, 699, 691, 690, 692, 720, 727, 738, 758, 741, 750, 759, 760, 773, 723, 677, 664, 780; 438/118, 622, 106, 623, 624, 650, 652, 121, 686

(56) References Cited

U.S. PATENT DOCUMENTS

| | | | |
|---|---|---|---|
| 4,910,581 A | * | 3/1990 | Baird |
| 6,022,797 A | * | 2/2000 | Ogasawara et al. |
| 6,111,310 A | | 8/2000 | Schultz ........................ 257/691 |
| 6,198,164 B1 | * | 3/2001 | Choi |
| 6,492,205 B1 | * | 12/2002 | Liu et al. |
| 6,509,646 B1 | * | 1/2003 | Lin et al. |
| 2002/0079575 A1 | * | 6/2002 | Hozoji et al. |
| 2002/0102835 A1 | * | 8/2002 | Stucchi et al. |
| 2003/0075357 A1 | * | 4/2003 | Ho et al. |

OTHER PUBLICATIONS

Wong and How, "Low cost flip chip bumping technologies," Proceedings of the 1st Electronic Packaging Technology Conference, Oct. 8–10, 1997, IEEE, p. 244–250.*

* cited by examiner

Primary Examiner—Nathan J. Flynn
Assistant Examiner—Kevin Quinto
(74) Attorney, Agent, or Firm—Luedeka, Neely & Graham, P.C.

(57) ABSTRACT

An integrated circuit having signal traces, power traces, and ground traces. The signal traces are disposed on at least one signal distribution layer, and the signal traces on the at least one signal distribution layer are formed at no more than a first thickness. The power traces and ground traces are formed on at least one power ground distribution layer, where the at least one power ground distribution layer is an overlying layer of the integrated circuit relative to the at least one signal distribution layer. The power traces and ground traces on the at least one power ground distribution layer are formed at no less than a second thickness that is greater than the first thickness of the signal traces. In this manner, the signal traces, which can be formed with a relatively thin thickness, can be placed very close together on the signal distribution layers, and have sufficient conductivity for the signals transmitted thereon. At the same time, the power and ground traces, which are typically required to carry a greater current, can be formed with a relatively thick thickness and with wider widths, without taking up precious space on the signal distribution layers. In this manner, the signal traces can be placed closed together, both because they are thinner and because space is not taken by power and ground traces on the same layer, and thus they require less space, and the integrated circuit can be made smaller.

20 Claims, 1 Drawing Sheet

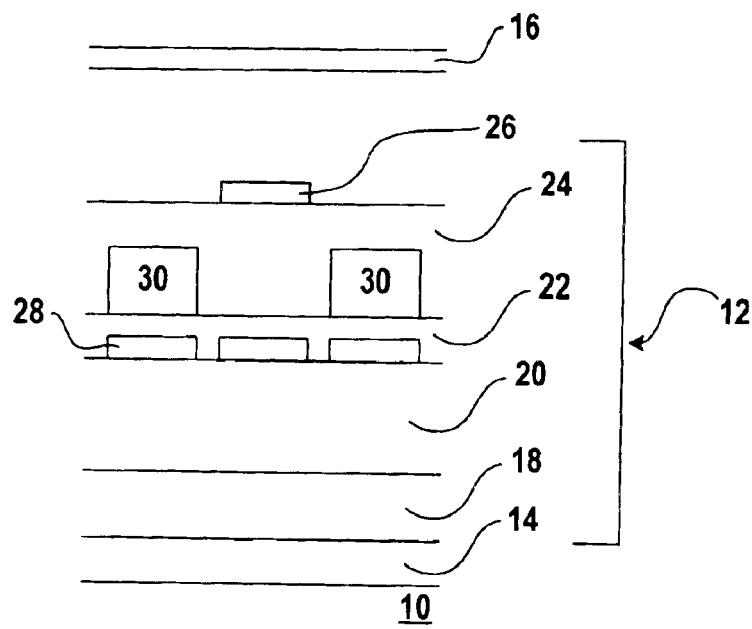
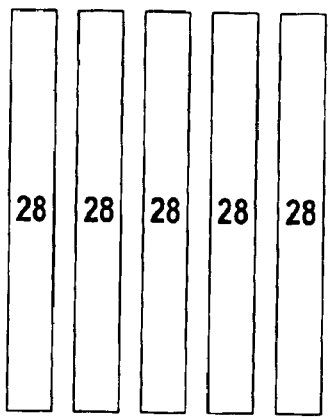
Fig. 2
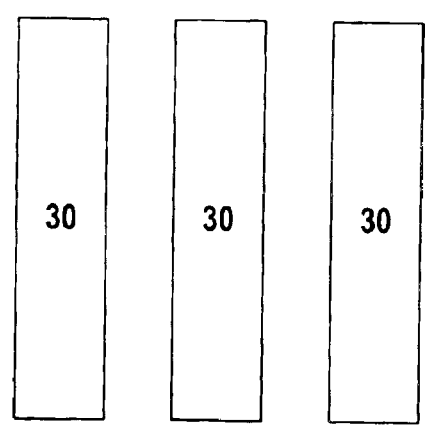
Fig. 3

US 6,867,488 B2

THICK METAL TOP LAYER

FIELD

This invention relates to the field of integrated circuit fabrication. More particularly, this invention relates to increasing integrated circuit density.

BACKGROUND

New methods and structures are constantly being introduced to increase the device density of integrated circuits. By this it is meant that the new methods and structures allow the individual components of an integrated circuit that is formed in a monolithic semiconducting substrate to be made smaller in size and placed closer together than they previously had been, thus placing a greater number of devices within a given surface area of the substrate than was previously possible. However, with the tremendous increase in device density comes new challenges, which were either less of an issue or not an issue at all at the prior lower device densities.

For example, as device densities increase, the number of electrically conductive traces used to electrically interconnect the individual devices also increases. Thus, more electrically conductive traces have to fit within the same amount of space as previously used, or in even a smaller amount of space, as the size of the integrated circuit is reduced. At first, the traces themselves could be made narrower, which provided more open space for the additional traces. When the traces could no longer be made narrower because of electrical conductance constraints, materials that were more electrically conductive were used, so that the traces could be made narrower still.

However, as device densities have continued to increase, even the narrower width of the more conductive materials tends to be insufficient, of itself, to allow for the continual increase in the number of electrically conductive traces that are required. One way to increase the conductivity of a trace without increasing the width, is to increase the thickness of the trace. However, current etching techniques, such as used to define the traces within a contiguously deposited layer of material, are typically not able to adequately define the thicker trace layers, because the aspect ratio of the etched areas between the traces becomes too great. In other words, the depth to which the area between adjacent traces must be etched is so deep, and the width of the etched area between adjacent traces is so narrow, that the methods used to define the traces tend to not adequately etch and define the traces.

Thus, in order to place the traces closer together, the electrically conductive layer needs to be relatively thinner. This is acceptable for some types of traces, such as signal traces. However other types of traces, such as power traces and ground traces, need to carry relatively higher current levels than signal traces. Therefore, forming power and ground traces at relatively thinner thicknesses so as to place the traces closer together tends to produce voltage drops that are unacceptable because of the increased resistance of the thinner traces.

There is a need, therefore, for a system of electrically interconnecting the devices within an integrated circuit, that will allow for even further increases in device densities.

SUMMARY

The above and other needs are met by an integrated circuit having signal traces, power traces, and ground traces. The signal traces are disposed on at least one signal distribution layer, and the signal traces on the at least one signal distribution layer are formed at no more than a first thickness. The power traces and ground traces are formed on at least one power ground distribution layer, where the at least one power ground distribution layer is an overlying layer of the integrated circuit relative to the at least one signal distribution layer. The power traces and ground traces on the at least one power ground distribution layer are formed at no less than a second thickness that is greater than the first thickness of the signal traces.

In this manner, the signal traces, which can be formed with a relatively thin thickness, can be placed very close together on the signal distribution layers, and have sufficient conductivity for the signals transmitted thereon. At the same time, the power and ground traces, which are typically required to carry a greater current, can be formed with a relatively thick thickness and with wider widths, without taking up precious space on the signal distribution layers. In this manner, the signal traces can be placed closer together, both because they are thinner and because space is not taken by power and ground traces. Thus, less space is required for the signal traces, and the integrated circuit can be made with a higher device density.

In various preferred embodiments, the second thickness is at least about one micron. Preferably the at least one power ground distribution layer also includes timing traces. The integrated circuit is preferably either a wire bond integrated circuit or a stud bump integrated circuit. Most preferably the signal traces, power traces, and ground traces are formed of copper. Also described herein is a packaged integrated circuit that includes the integrated circuit described above.

Additionally described is a method of fabricating an integrated circuit. Signal distribution layers are formed with signal traces at no more than a first thickness. No power traces and no ground traces are formed on the signal distribution layers. Power ground distribution layers are formed with power traces and ground traces at no less than a second thickness, where the second thickness is greater than the first thickness. The power ground distribution layers overlie the signal distribution layers.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein:

FIG. 1 is a cross sectional view of a portion of a packaged integrated circuit, depicting a signal distribution layer and an overlying power ground distribution layer, FIG. 2 is a top plan view of a portion of a signal distribution layer, and FIG. 3 is a top plan view of a portion of a power ground distribution layer.

DETAILED DESCRIPTION

With reference now to FIG. 1, there is depicted a cross sectional view of a portion of a packaged integrated circuit 10, including an integrated circuit 12, package substrate 14, and cover 16. The integrated circuit 12 includes a substrate 18, device layers 20, a signal distribution layer 22, an overlying power ground distribution layer 24, and a bonding pad 26. It is appreciated that in actual implementation there would preferably be more than one signal distribution layer 22 and more than one overlying power ground distribution layer 24. However, only one of each layer 22 and 24 is depicted in FIG. 1 for the sake of simplicity and so as to not unnecessarily complicate the drawing with redundant elements that are not required for an understanding of the invention. It is further appreciated that the device layers 20 preferably comprise many layers in which structures and devices such as transistors are formed, and which again are not specifically depicted so as to not unnecessarily encumber the drawings.

FIG. 1 also depicts the power ground distribution layer 24 as immediately overlying the signal distribution layer 22. However, in various embodiments, there may be other intervening layers between the power ground distribution layer 24 and the underlying signal distribution layer 22. As seen in FIG. 1, the signal traces 28 on the signal distribution layer 22 are formed to a relatively thinner thickness and are relatively closer together. By contrast, the power and ground traces 30 on the power ground distribution layer 24 are formed to a relatively thicker thickness and are relatively farther apart. In this manner, the power and ground traces 30 are formed with a thickness sufficient to reduce, and more preferably eliminate, any substantial voltage drops due to current resistance effects, while the signal traces 28 are formed with a thinner thickness such that they can be placed closer together, and thereby not hamper other efforts to increase the device density of the integrated circuit 12.

With reference now to FIG. 2, there is depicted a top plan view of a portion of the signal routing layer 22, showing the relatively narrow spacing between the signal traces 28. Depicted in FIG. 3, by contrast, is a top plan view of a portion of the power ground routing layer 24, showing the relatively wide spacing between the power and ground traces 30. The signal traces 28 are preferably no greater than a standard thickness for such traces, which is most preferably much thinner than about one micron. The power and ground traces 30, however, are preferably much thicker than standard signal traces, and are most preferably at least about one micron in thickness. In a most preferred embodiment, the signal traces 28 and power and ground traces 30 are all formed of copper. The present invention is particularly desirable for wire bond or stud bump integrated circuits 12, because they tend to have designs that allow for very high device densities, and thus the routing scheme of the present invention would particularly assist in such increased device densities.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. In an integrated circuit having signal traces, power traces, and ground traces, where the signal traces are disposed on at least one signal distribution layer, and the signal traces on the at least one signal distribution layer are formed at no more than a first thickness, the improvement comprising forming the power traces and ground traces on at least one power ground distribution layer, where the at least one power ground distribution layer is an overlying layer of the integrated circuit relative to the at least one signal distribution layer, and the power traces and ground traces on the at least one power ground distribution layer are formed at no less than a second thickness that is greater than the first thickness of the signal traces, and the at least one power ground distribution layer underlies a bonding pad layer of the integrated circuit.

2. The integrated circuit of claim 1, wherein the second thickness is at least about one micron.

3. The integrated circuit of claim 1, wherein the at least one power ground distribution layer also includes timing traces.

4. The integrated circuit of claim 1, wherein the integrated circuit is a wire bond integrated circuit.

5. The integrated circuit of claim 1, wherein the integrated circuit is a stud bump integrated circuit.

6. The integrated circuit of claim 1, wherein the signal traces are formed of copper.

7. The integrated circuit of claim 1, wherein the power traces and ground traces are formed of copper.

8. In a packaged integrated circuit including an integrated circuit having signal traces, power traces, and ground traces, where the signal traces are disposed on at least one signal distribution layer, and the signal traces on the at least one signal distribution layer are formed at no more than a first thickness, the improvement comprising forming the power traces and ground traces on at least one power ground distribution layer, where the at least one power ground distribution layer is an overlying layer of the integrated circuit relative to the at least one signal distribution layer, and the power traces and ground traces on the at least one power ground distribution layer are formed at no less than a second thickness that is greater than the first thickness of the signal traces, and the at least one power around distribution layer underlies a bonding pad layer of the integrated circuit.

9. The packaged integrated circuit of claim 8, wherein the second thickness is at least about one micron.

10. The packaged integrated circuit of claim 8, wherein the at least one power ground distribution layer also includes timing traces.

11. The packaged integrated circuit of claim 8, wherein the integrated circuit is a wire bond integrated circuit.

12. The packaged integrated circuit of claim 8, wherein the integrated circuit is a stud bump integrated circuit.

13. The packaged integrated circuit of claim 8, wherein the signal traces are formed of copper.

14. The packaged integrated circuit of claim 8, wherein the power traces and ground traces are formed of copper.

15. In a method of fabricating an integrated circuit, the improvement comprising the steps of:

forming at least one signal distribution layer with signal traces at no more than a first thickness, where no power traces and no ground traces are formed on the at least one signal distribution layer, forming at least one power ground distribution layer with power traces and ground traces at no less than a second thickness, where the second thickness is greater than the first thickness, and the at least one power ground distribution layer overlies the at least one signal distribution layer, and forming a bonding pad layer overlying the at least one power ground distribution layer.

16. The method of claim 15, wherein the second thickness is at least about one micron.

17. The method of claim 15, wherein the at least one power ground distribution layer also includes timing traces.

18. The method of claim 15, wherein the integrated circuit is a wire bond integrated circuit.

19. The method of claim 15, wherein the integrated circuit is a stud bump integrated circuit.

20. The method of claim 15, wherein the signal traces, power traces, and ground traces are farmed of copper.

* * * * *